United States Patent
Chen et al.

(10) Patent No.: US 7,155,378 B2
(45) Date of Patent: Dec. 26, 2006

(54) METHOD FOR PROVIDING CYCLE-BY-CYCLE AD HOC VERIFICATION IN A HARDWARE-ACCELERATED ENVIRONMENT

(75) Inventors: Liang T. Chen, Saratoga, CA (US); David R. Emberson, Santa Cruz, CA (US); Keith H. Bierman, San Jose, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 644 days.

(21) Appl. No.: 10/320,108

(22) Filed: Dec. 16, 2002

(65) Prior Publication Data

US 2004/0117747 A1 Jun. 17, 2004

(51) Int. Cl.
*G06F 17/50* (2006.01)
*G06F 9/45* (2006.01)
(52) U.S. Cl. .................. 703/14; 716/4; 716/5
(58) Field of Classification Search ............... 714/741; 716/4; 703/14
See application file for complete search history.

(56) References Cited

U.S. PATENT DOCUMENTS 6,009,256 A * 12/1999 Tseng et al. ................. 703/13
6,272,451 B1 * 8/2001 Mason et al. ................ 703/13
6,295,623 B1 * 9/2001 Lesmeister et al. ......... 714/741

OTHER PUBLICATIONS

John Hayes, Transition Count Testing Of Combinational Logic Circuits, Jun. 1976, IEEE Transactions On Computers, vol. C-25, No. 6, pp. 613-620.*

* cited by examiner

*Primary Examiner*—Paul Rodriguez
*Assistant Examiner*—Juan Ochoa
(74) *Attorney, Agent, or Firm*—Osha Liang LLP

(57) ABSTRACT

A method of providing ad hoc verification for a simulation includes generating a cumulative record of a state value for the simulation of a circuit design, comparing the cumulative record of the state value to a golden record of the state value to obtain a comparison result, and performing ad hoc verification of the circuit design using the comparison result.

4 Claims, 5 Drawing Sheets

US 7,155,378 B2

METHOD FOR PROVIDING CYCLE-BY-CYCLE AD HOC VERIFICATION IN A HARDWARE-ACCELERATED ENVIRONMENT

BACKGROUND OF INVENTION

Manufacturers of highly complex circuit designs, such as Central Processing Units (CPU's), typically require verification of design in order to verify that the circuits are designed properly. One common method of design verification is ad hoc verification. Ad hoc verification allows two different implementations of a design to be compared. Equivalence checkers use mathematical methods to formally compare a first version of a design with a second version of the design, checking that logic functions in the first version are equivalent to logic functions in the second version. Typically, with ad hoc verification, one of the versions already has been verified, and serves as a specification, or reference, against which the other version is verified.

Ad hoc verification may be implemented using entities shown in FIG. 1. An Instruction Set Simulator (ISS) (10) is typically a computer program (e.g., written in C++) running on a conventional computer. A Hardware Definition Language (HDL) simulator (12) generally runs a program written in an HDL, such as Verilog. Often, the HDL simulator (12) runs on the same conventional computer upon which the ISS runs. Sometimes the HDL simulator (12) is implemented on a hardware accelerator, such as CoBALT™ (a registered trademark of Cadence Design Systems, Inc.). A simulation design (14), i.e., a circuit design, is used to create an ISS simulation (16) and an HDL simulation (18). Both the ISS (10) and the HDL simulator (12) send results to a comparator (20), and output of the comparator (20) is sent to a diagnostic output device (22).

Ad hoc verification using entities shown in FIG. 1 may be implemented as shown in a flow diagram in FIG. 2. First, a simulation design is generated (Step 50). The simulation design may be written in an HDL, such as Verilog. Then, the ISS simulation and the HDL simulation are generated using the simulation design (Step 52). Once generated, the ISS simulation and the HDL simulation are input into the ISS and the HDL simulator (Step 54), and a current cycle of both of the ISS simulation and of the HDL simulation is executed (Step 56). At the start of both the ISS simulation and the HDL simulation, a first cycle is executed. The ISS simulation and the HDL simulation are synchronized with respect to simulation cycles.

Next, the ISS simulation results and the HDL simulation results for the current cycle are sent from the ISS and the HDL simulator, respectively, to the comparator (Step 58). Because the ISS and the HDL simulator often operate at different speeds, there is often a time lag between output of the ISS and the HDL simulator, especially if the HDL simulator is a hardware accelerator. Thus, an issue of communication bottlenecks caused by different speeds of simulation is often a concern when using ad hoc verification.

Once both the HDL simulator and the ISS simulation results for the current cycle are received by the comparator, the results are compared (Step 60). Comparison of the HDL simulation and the ISS simulation results involve comparing state of the HDL simulation and the ISS simulation. For example, the simulation design may include a particular element (e.g., a gate, an adder, a register, etc.). The output value (i.e., a "1" or a "0") of the element at each cycle is a portion of the state of the simulation, for both the HDL simulation and the ISS simulation.

A determination is then made as to whether the results of the ISS simulation and the HDL simulation match (Step 62). If the results do match, a determination is made as to whether the simulation has ended (Step 64). If the simulation has not ended, the ISS simulation and the HDL simulation are both advanced to a next cycle (Step 66).

Otherwise, if the results of the ISS simulation and the HDL simulation do not match, the results are labeled a failure (Step 68), and diagnostic output is generated (Step 70). A determination is then made as to whether the simulation has ended (Step 64). If the simulation has not ended, the ISS simulation and the HDL simulation are both advanced to a next cycle (Step 66), and both simulations continue until both simulations end.

Although cycle-by-cycle verification as shown in FIG. 2 is appropriate for certain verification implementations, in other verification implementations, execution of the simulation design may be required to run for multiple cycles before comparison between the HDL simulation and the ISS simulation. For example, the HDL simulation and the ISS simulation may run for 10,000 cycles, and then state values of the HDL simulation and the ISS simulation are compared.

For verification implementations that use multiple cycle runs, e.g., 10,000 cycles, designers of circuit verification systems may address certain error detection issues that may arise. For example, if a simulation runs 10,000 cycles, a possibility arises that a first error may occur at a particular cycle, e.g., cycle 1000. The first error causes an improper state value for a particular element. For example, an adder may have an improper state of "1" at the end of cycle 1000, where a proper state is "0". As the simulation progresses, a second error may occur at cycle 2000. The second error may occur so as to erase the effect of the first error. Thus, after 10,000 simulation cycles, a comparison of the state of the simulation with the state of a reference simulation may show that no error ever occurred, because the second error erased the effect of the first error.

SUMMARY OF INVENTION

In general, in one aspect, a method of providing ad hoc verification for a simulation comprises generating a cumulative record of a state value for the simulation of a circuit design, comparing the cumulative record of the state value to a golden record of the state value to obtain a comparison result, and performing ad hoc verification of the circuit design using the comparison result.

In general, in one aspect, a method of providing ad hoc verification for a simulation comprises obtaining a circuit design for the simulation, selecting an element of the circuit design, obtaining a state value of the element using an instrumented simulator, generating a cumulative record of the state value for the simulation of the circuit design, obtaining a golden record of the state value, comparing the cumulative record of the state value to the golden record of the state value to obtain a comparison result, and performing ad hoc verification of the circuit design using the comparison result.

In general, in one aspect, a system for providing ad hoc verification for a simulation comprises a golden record of state values for a plurality of cycles of the simulation, an instrumented instruction set simulator configured to obtain a first state value and a second state value of the simulation, a checksum unit configured to generate a cumulative record of state values for the plurality of cycles using the first state value and the second state value, and a comparator configured to compare the cumulative record of state values with the golden record of state values.

In general, in one aspect, a system for providing ad hoc verification for a simulation comprises a golden record of state values for a plurality of cycles of the simulation, an instrumented instruction set simulator configured to obtain a first state value and a second state value of the simulation, a checksum unit configured to generate a cumulative record of state values for the plurality of cycles using the first state value and the second state value, a comparator configured to compare the cumulative record of state values with the golden record of state values, an instruction set simulator simulation comprising a plurality of instructions for performing the simulation using the instrumented instruction set simulator, a cycle count breakpoint causing the comparator to compare the cumulative record of state values with the golden record of state values, a companion simulator and a reference simulator performing a secondary simulation for the plurality of cycles using the ISS simulation if the comparator generates a predetermined value of a comparison result, and a diagnostic output device for generating diagnostic output using a result of the secondary simulation.

In general, in one aspect, a computer system for providing cycle-by-cycle ad hoc verification for a simulation comprises a processor, a memory, a storage device, and software instructions stored in the memory for enabling the computer system to perform generating a cumulative record of a state value for the simulation of a circuit design, comparing the cumulative record of the state value to a golden record of the state value to obtain a comparison result, and performing ad hoc verification of the circuit design using the comparison result.

In general, in one aspect, an apparatus for providing cycle-by-cycle ad hoc verification for a simulation comprises means for generating a cumulative record of a state value for the simulation of a circuit design, means for comparing the cumulative record of the state value to a golden record of the state value to obtain a comparison result, and means for performing ad hoc verification of the circuit design using the comparison result.

Other aspects and advantages of the invention will be apparent from the following description and the appended claims.

DETAILED DESCRIPTION

Figure 1:
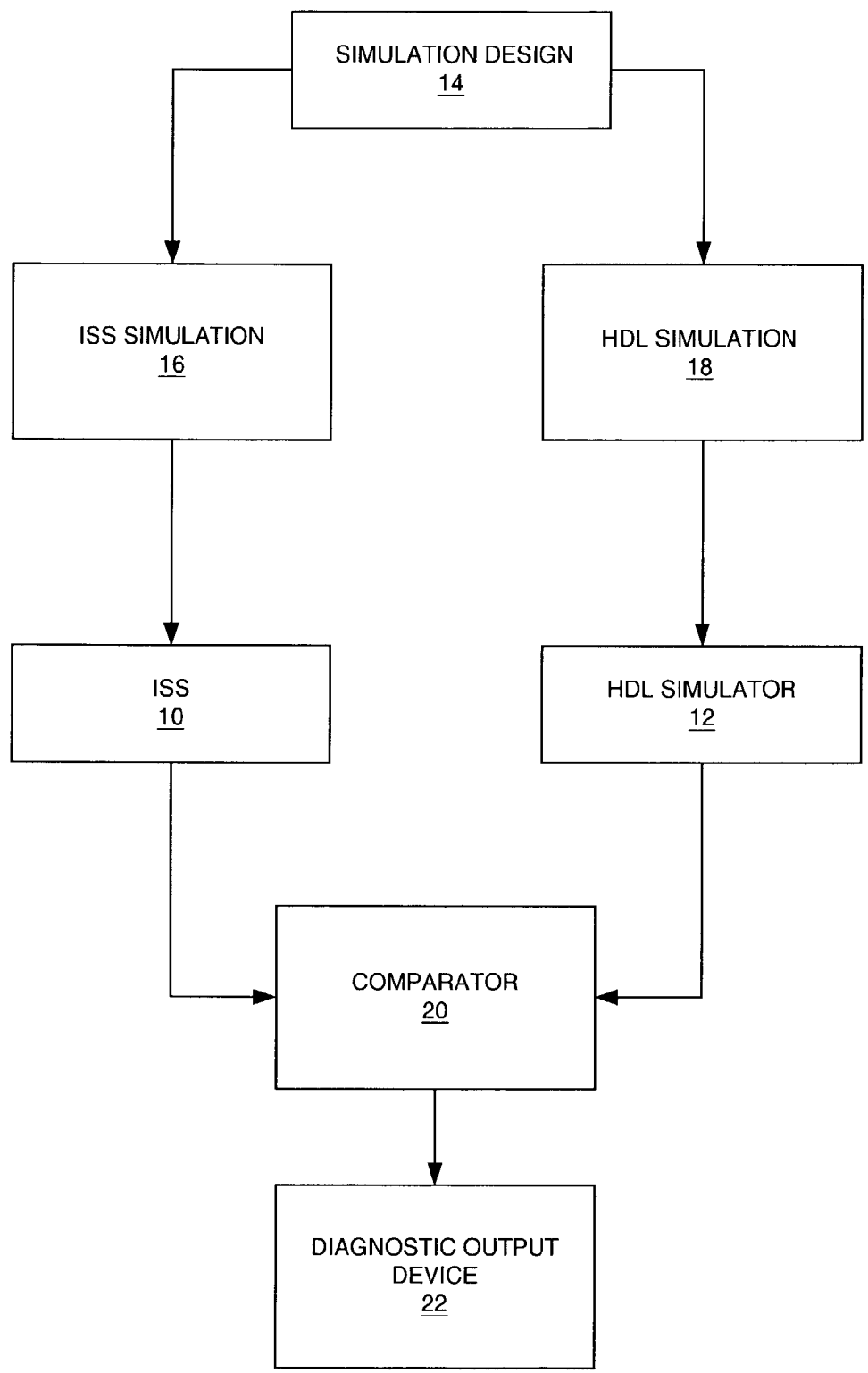
FIG. 1 shows entities used in ad hoc verification.
Figure 2:
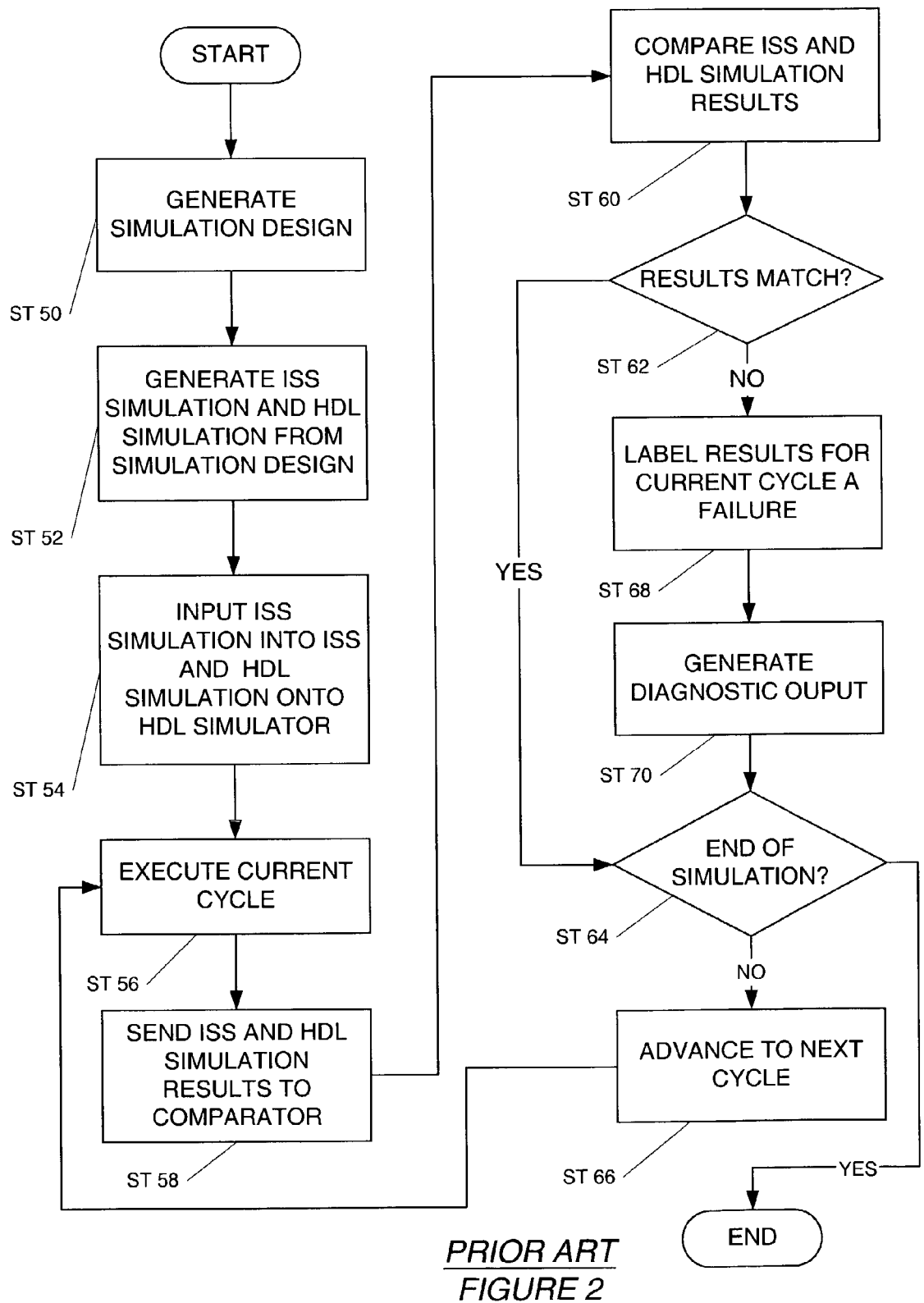
FIG. 2 shows a flow diagram for ad hoc verification.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 3:
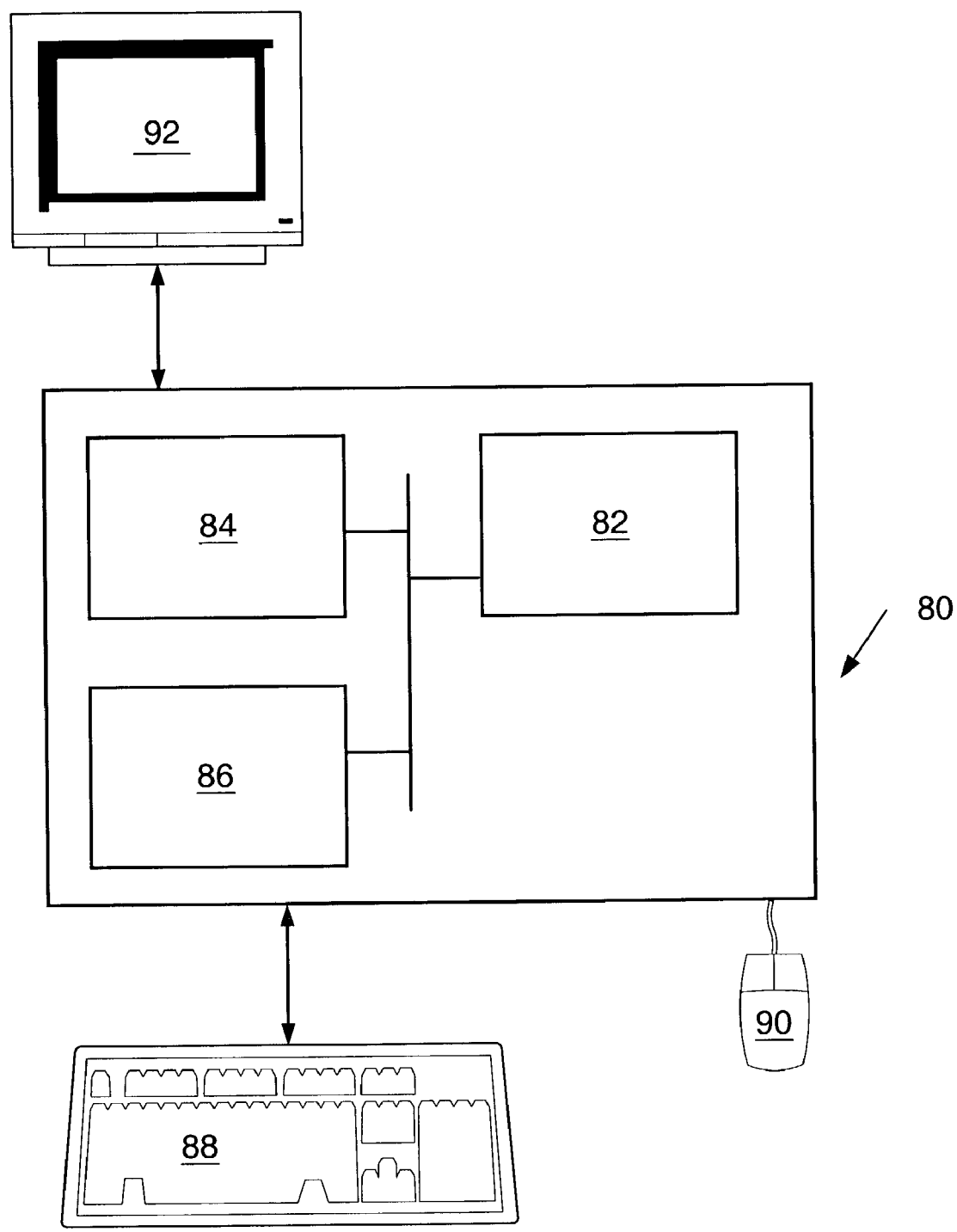
FIG. 3 shows a typical computer system.

The invention may be implemented on virtually any type computer regardless of the platform being used. For example, as shown in FIG. 3, a typical computer (80) includes a processor (82), an associated memory (84), a storage device (86), and numerous other elements and functionalities typical of today's computers (not shown). The computer (80) may also include input means, such as a keyboard (88) and a mouse (90), and an output device, such as a monitor (92). In accordance with an embodiment of the invention, the computer (80) is networked. Those skilled in the art will appreciate that these input and output means may take other forms.

Figure 4:
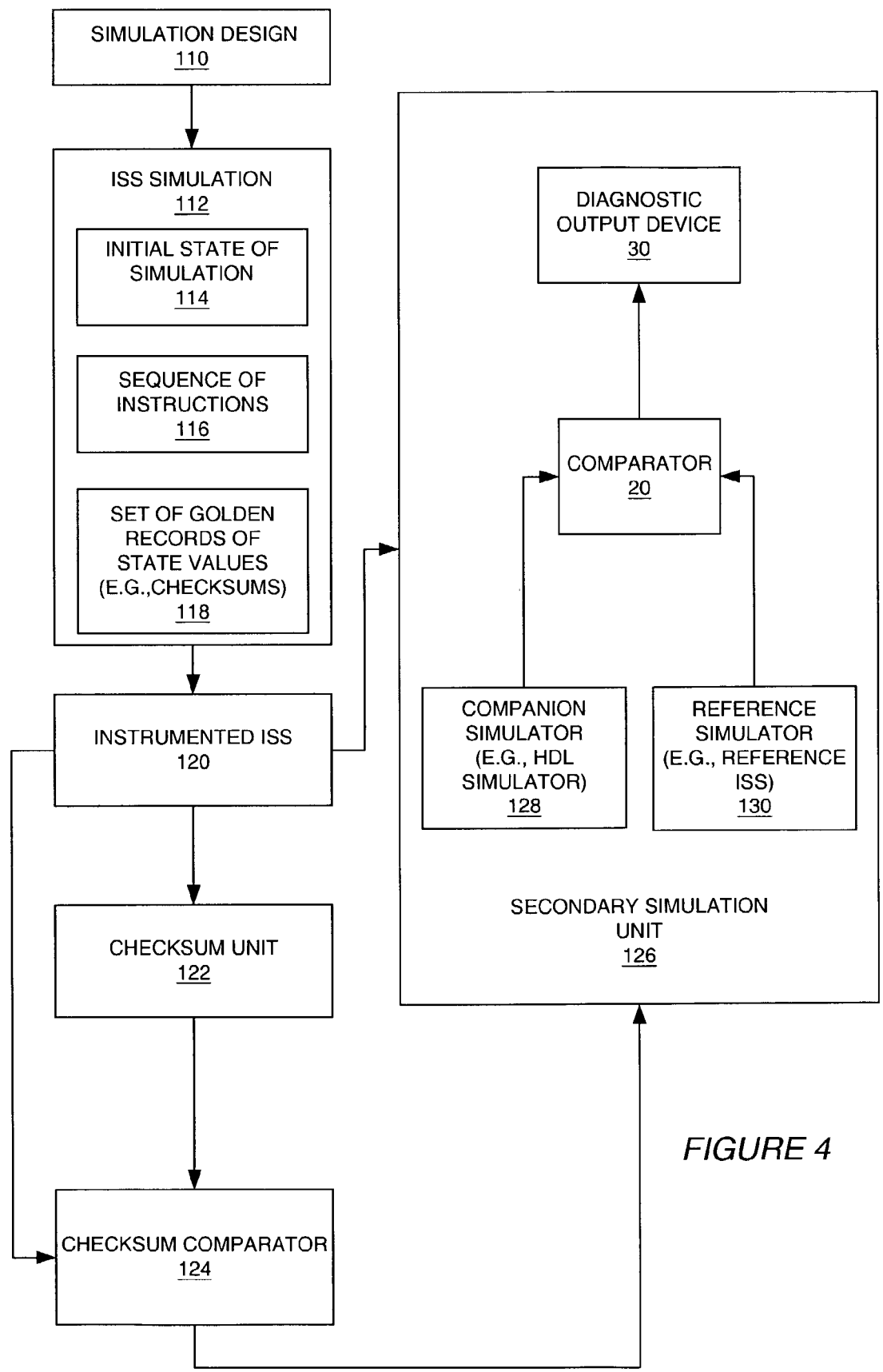
FIG. 4 shows entities included in a system for ad hoc verification, in accordance with an embodiment of the invention.

One or more aspects of the invention relate to providing cycle-by-cycle ad hoc verification for simulations running for multiple cycles without comparison to a reference simulation. In accordance with an embodiment of the invention, entities included in a system for providing ad hoc verification for a simulation are shown as a flow diagram in FIG. 4. A simulation design (110) is used as input for an ISS simulation (112). The ISS simulation (112) includes a initial state of the simulation (114), a sequence of instructions (116) for performing the simulation, and a set of golden records of state values (118). A golden record of state values, in accordance with an embodiment of the function, includes a hash function, such as a checksum.

The ISS simulation (112) is an input into an instrumented simulator, such as an instrumented ISS (120). The instrumented ISS (120) obtains the state of the simulator. The instrumented ISS (120) may be instrumented via multiple mechanisms. In accordance with an embodiment of the invention, scripting language statements may be used to obtain state values associated with elements of the simulation design (110). For example, if the simulation design (110) includes an Arithmetic Logic Unit (ALU) with a stack, a scripting language statement, such as "ISS (Stack)" may be used to access and use a state value of the stack. In accordance with an embodiment of the invention, the instrumented ISS (120) is a computer program written in a high level programming language, such as C++.

The instrumented ISS (120) sends an output to a checksum unit (122), including measurements of the state of the simulation, as measured by the instrumented ISS (120). The instrumented ISS (120) also sends an output to a checksum comparator (124), including checksum values from the set of golden records of state values (118). The checksum comparator (124) also receives input from the checksum unit (122).

Output from the checksum comparator (124) is sent to the secondary simulation unit (126), which includes a companion simulator (128), e.g., an HDL simulator, and a reference simulator (130), e.g., a reference ISS. The companion simulator (128) and the reference simulator (130) send simulation results for each cycle to the comparator (20) for comparison, and the comparator (20) sends diagnostic output to the diagnostic output device (30). Entities included in the secondary simulation unit (126) operates similarly to entities included in FIG. 1.

Figure 5:
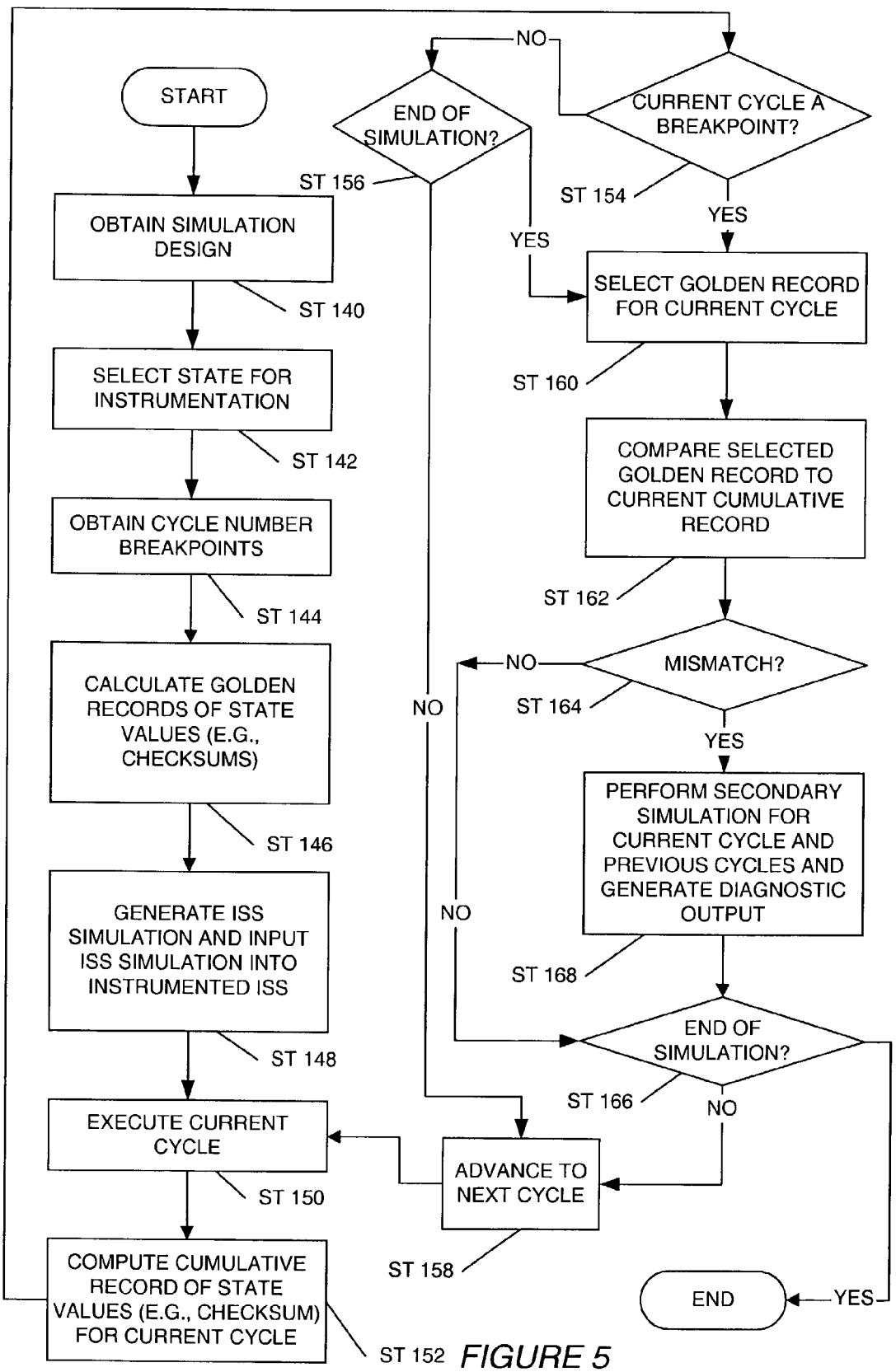
FIG. 5 shows a flow diagram for ad hoc verification, in accordance with an embodiment of the invention.

FIG. 5 shows a flow diagram for performing ad hoc verification, in accordance with an embodiment of the invention. First, a simulation design is obtained (Step 140). For example, a simulation designer may generate the simulation design using an HDL, such as Verilog. Then, an appropriate state of the simulation is selected for instrumentation (Step 142). The appropriate state may be selected by a designer of the simulation design. For example, a selected state of the simulation may be an output value of a particular element, such as a circuit module (as written in an HDL, such as Verilog), an adder, an AND gate, etc. Multiple states may be selected for instrumentation. When the selected state of the simulation is instrumented, the instrumented ISS is able to measure and record the output value of the element that represents the selected state for each cycle of the simulation.

A set of cycle number breakpoints is obtained (Step 144). The designer of the simulation design may generate the set of cycle number breakpoints. A cycle number breakpoint is used to determine at which particular cycle number of the simulation a comparison is made between a checksum of the set of golden records of state values, and a cumulative record of state values (e.g., a cumulative checksum) for a particular state of the simulation. For example, a cycle number breakpoint may be generated for cycle number 1000.

Next, a set of golden records of state values (e.g., a checksum) is calculated (Step 146). In accordance with an embodiment of the invention, each golden record is associated with a corresponding state value calculated as output for a circuit module or an output of a element, e.g., a half adder or AND gate, etc. For example, a first golden record may be calculated for a first state (e.g., an output of a half adder). Those skilled in the art will realize that other embodiments of the invention may generate golden records associated with more states, e.g., the first golden record of the set of golden records of state values may be associated with both the first state and a second state.

Each golden record represents one or more instances of proper (i.e., "golden") cumulative records of state values for the simulation from a starting point of the simulation (e.g., simulation cycle 0) through to a particular user-defined cycle number of the simulation. For example, the first golden record may represent a proper cumulative state from the starting point of the simulation through to a user-defined cycle number of the simulation, e.g., cycle 1000, of the simulation for a particular state (or combination of states).

Each golden record (e.g., checksum, Cyclic Redundancy Check (CRC), hash function, etc.) takes as input a sequence of numbers. Each number included in the sequence of numbers represents a proper, cumulative state value at a particular cycle number for a particular element. For example, the proper, cumulative state value may be a value for an output of a element, such as a circuit module, an adder, an AND gate, etc.

For each cycle of the simulation, the output of the element has a particular value. For example, for cycle N, an output value of the AND gate may be 0, and for cycle N+k, the output value of the AND gate may be 1. Thus, considering a particular state (i.e., the output value of the particular element) during a particular contiguous range of cycles of the simulation (e.g., from cycle 0 to cycle 1000), a sequence of numbers (e.g., 01001000010 . . . ) may be measured using instrumentation. Thus, a record of state values (e.g., a checksum) that takes as input the sequence of numbers is a cumulative record of state values over a contiguous range of cycles (e.g., cycle 0 to cycle 1000).

Each golden record of the set of golden records of state values is cumulative with respect to a particular cycle number. For example, a first golden record may represent a proper checksum for a sequence of numbers that represents state values from cycle 0 to cycle 1000. A second golden record may represent a proper checksum for a sequence of numbers that represents state values from cycle 0 to cycle 5000. In accordance with an embodiment of the invention, the ISS simulation includes information (e.g., a file) that associates each golden record with a particular cycle of the simulation. Each golden record is generated using a proper sequence of numbers, where the sequence of numbers is proper because the sequence of numbers is what is expected as output (i.e., a measured state value) of the simulation design over a contiguous range of cycles (e.g., cycle 0 to cycle 1000).

Once the set of golden records of state values is calculated, the ISS simulation is generated and input into the instrumented ISS (Step 148). In accordance with an embodiment of the invention, the checksum unit is set to zero before performing the simulation. The simulation begins with execution of a current cycle of the simulation design (Step 150). When the test begins, the current cycle is an initial cycle.

After execution of the current cycle, a cumulative record of state values for the current cycle is computed (Step 152). For example, for a particular state value (e.g., referring to the previous example, the output of the adder), for a particular current cycle (e.g., cycle 5), a sequence of numbers may be obtained using the instrumented ISS. Thus, over a range of 6 cycles (cycle 0 through cycle 5), the sequence of numbers may be equal to, for example, "010110." Therefore, the cumulative record of state values may be a checksum (such as a CRC) that has as an input, "010110." For the current cycle, the checksum unit combines the accumulated state values with the current state value, thus generating the cumulative state values, which is represented numerically, and from which the checksum (i.e., the cumulative record of state values) is computed.

A determination is then made as to whether the current cycle is a cycle number breakpoint (Step 154). If the current cycle is not a cycle number breakpoint, a determination is made as to whether the simulation has ended (Step 156). If the simulation has not ended, the simulation advances the current cycle to a next cycle (Step 158), and the current cycle is executed (Step 150).

Otherwise, if the current cycle is a cycle number breakpoint, or the simulation has ended, a golden record is selected for the current cycle (Step 160). For example, if the current cycle is cycle 5, the golden record for cycle 5 is selected. Then, a comparison is made between the selected golden record and the cumulative record, i.e., the cumulative record of state values, for the current cycle (Step 162). For example, referring to the previous example where for cycle 0 through cycle 5, the proper sequence of numbers equals "010110," and is used to generate a golden record, using a checksum, which takes "010110" as an input. The cumulative record is generated using a checksum that takes as input whatever sequence of numbers is measured through to the current cycle using the instrumented ISS.

A determination is then made as to whether a mismatch exists between the selected golden record and the cumulative record for the current cycle for any particular state value or combination of state values (Step 164). For example, if the selected golden record is a first checksum that has as an input a first sequence of numbers equal to "010110," and the cumulative record for the current cycle is a second checksum that has as an input a second sequence of numbers equal to "100110," then a mismatch may exist, depending upon how sophisticated an algorithm is used for the first and second checksum.

If no mismatch exists, then a determination is made as to whether the simulation has ended (Step 166). If the simulation has not ended, the simulation advances to a next cycle (Step 158). Otherwise, if a mismatch does exist, a secondary simulation is performed for the current cycle and previous cycles, for which diagnostic output is produced (Step 168). Information required to perform the secondary simulation is sent to the secondary simulation unit.

For example, if the current cycle is cycle 1000, then, in accordance with an embodiment of the invention, portions of the ISS simulation and appropriate golden checksums and other necessary information may be sent to the secondary simulation unit. The secondary simulation unit then performs a simulation from cycle 0 through cycle 1000, stopping every cycle to perform a check between a state value of a reference ISS simulation and a state value of a companion HDL simulation. Thus, a particular cycle of the simulation using the simulation design where the improper state value appears may be determined. For example, the secondary simulation may determine an improper state value appears in cycle 990.

Those skilled in the art will appreciate that the order and sequence of steps as shown in FIG. 5 may differ among embodiments of the invention. For example, in accordance with an embodiment of the invention, the order of Step 144 and Step 142 may be reversed.

Advantages of various embodiments of the present invention may include one or more of the following. In one or more embodiments, the present invention affords the ability to detect which particular cycle of a simulation causes an improper state without having to compare a state of the simulation to a state of a reference simulation at each cycle of the simulation. Thus, verification through ad hoc verification may be accelerated because cycle-by-cycle ad hoc verification may be avoided for a first subset of cycles in the simulation, and instead, cycle-by-cycle ad hoc verification may be used for only a second subset of an entirety of cycles of the simulation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for providing ad hoc verification for a simulation, comprising:
    a golden record of state values for a plurality of cycles of the simulation, wherein the plurality of cycles defines a block of cycles ending with a breakpoint;
    an instrumented instruction set simulator configured to obtain a first state value and a second state value of the simulation;
    a checksum unit configured to generate a cumulative record of state values for the plurality of cycles using the first state value and the second state value;
    a comparator configured to compare the cumulative record of state values with the golden record of state values;
    an instruction set simulator simulation comprising a plurality of instructions for performing the simulation using the instrumented instruction set simulator;
    a companion simulator and a reference simulator performing a secondary cycle-by-cycle simulation for the block of cycles using the instruction set simulator simulation if the comparator generates a predetermined value of a comparison result; and
    a diagnostic output device for generating diagnostic output using a result of the secondary simulation.

2. The system of claim 1, wherein the golden record of state values is a checksum.

3. The system of claim 1, wherein the cumulative record of state values is a checksum for the plurality of cycles.

4. The system of claim 1, wherein the plurality of cycles is contiguous.

* * * * *